(12) United States Patent
Verheijden et al.

(10) Patent No.: US 7,361,453 B2
(45) Date of Patent: Apr. 22, 2008

(54) METHOD FOR CREATING A PATTERN IN A MATERIAL AND SEMICONDUCTOR STRUCTURE PROCESSED THEREWITH

(75) Inventors: Greja Johanna Adriana Maria Verheijden, Valkenswaard (NL); Pascal Henri Leon Bancken, Opwijk (BE); Johannes van Wingerden, AL Hardinxveld-Giessendam (NL)

(73) Assignees: Interuniversitair Microelektronica Centrum vzw (IMEC), Leuven (BE); Koninklijke Philips Electronics, Eindhoven (NL)

( * ) Notice: Subject to any disclaimer, the term of this patent is extended or adjusted under 35 U.S.C. 154(b) by 384 days.

(21) Appl. No.: 11/081,797

(22) Filed: Mar. 15, 2005

(65) Prior Publication Data

US 2005/0214690 A1    Sep. 29, 2005

(30) Foreign Application Priority Data

Mar. 16, 2004    (EP) .................................. 04101072

(51) Int. Cl.
*G03F 7/00* (2006.01)
(52) U.S. Cl. ...................... 430/311; 430/312; 430/313; 430/316
(58) Field of Classification Search ................ 430/323, 430/313, 394
See application file for complete search history.

(56) References Cited

U.S. PATENT DOCUMENTS 6,458,516 B1 * 10/2002 Ye et al. ..................... 430/317

6,605,541 B1 * 8/2003 Yu .............................. 438/700
2003/0003401 A1   1/2003 Wiltshire

FOREIGN PATENT DOCUMENTS

| JP | 05343279 | | 12/1993 |
|----|----------|----|---------|
| JP | 2000-223490 | * | 8/2000 |
| JP | 2000-223490 A | | 8/2000 |
| JP | 2000223490 | | 11/2000 |
| KR | 940010508 B | | 10/1994 |

* cited by examiner

*Primary Examiner*—Mark F. Huff
*Assistant Examiner*—Caleen O. Sullivan
(74) *Attorney, Agent, or Firm*—Knobbe Martens Olson & Bear LLP

(57) ABSTRACT

A method of manufacturing a semiconductor device with precision patterning is disclosed. A structure of a small dimension is created in a material, such as a semiconductor material, using a first and a second pattern, the patterns being identical but displaced over a distance with respect to each other. Two mask layers are used, wherein the first pattern is etched into the upper mask layer with a selective etch, and the second pattern is created on the upper mask layer or on the lower mask layer at locations where the upper mask layer has been removed. A part of the lower mask layer and/or the upper mask layer is etched according to the second pattern, resulting in a mask formed by remaining parts of the lower and upper mask layers, the mask having a structure with a dimension determined by a displacement of the second pattern with respect to the first pattern.

8 Claims, 4 Drawing Sheets

METHOD FOR CREATING A PATTERN IN A MATERIAL AND SEMICONDUCTOR STRUCTURE PROCESSED THEREWITH

BACKGROUND OF THE INVENTION

1. Field of the Invention

The invention relates to a method of manufacturing a semiconductor device wherein a pattern is created in a material using two mask layers.

2. Description of the Related Technology

Patent Abstracts of Japan, 2000-223490 describes the manufacture of a semiconductor device. On a silicon oxide film, an organic layer is formed. The organic layer is then covered by two stacked inorganic masks, such that the lower inorganic mask protects the organic layer while removing resist.

A problem associated with the prior art is that dimensions in microcircuits, such as integrated circuits, are becoming smaller and smaller. Dimensions of patterns defined in such materials, or other materials, are however limited by a resolution of an imaging system for applying the pattern on the material. Thus, dimensions of structures such as trenches and IMD are limited by a resolution of the imaging system.

SUMMARY OF CERTAIN INVENTIVE EMBODIMENTS

A goal of various aspects of the invention is to enable providing structures having smaller dimensions.

The method according to one aspect of the invention includes creating, by way of the lithographic mask, a second pattern on the upper mask layer or on the lower mask layer at locations where the upper mask layer has been removed, the mask being displaced over a distance such that the second pattern is displaced with respect to the first pattern, and removing a part of the lower mask layer and/or the upper mask layer in accordance with at least the second pattern and removing a part of the material in accordance with a mask formed by remaining parts of the lower and the upper mask layers.

First, the upper mask layer is patterned in accordance with the lithographical mask. Then, the mask is displaced over a distance, and a second pattern is created which is thus substantially identical to the first pattern but displaced over said distance with respect to the first pattern. The second pattern is provided on the upper mask layer or on the lower mask layer at the locations where the upper mask layer has been removed in dependency on the first pattern. Next, in accordance with at least the second pattern, a part of the lower mask layer and/or the upper mask layer is removed. As a result, a mask is created by the remaining parts of the lower mask layer and the upper mask layer. A resolution of this resulting mask is exclusively determined by the resolution of the imaging system which projects the lithographic mask on the respective layer. Due to the displacement however, structures can be created with a resolution determined mainly by the accuracy of the displacement. Due to the displacement of the mask, and thus due to the displacement of the second pattern with respect to the first pattern, resulting structures having a small dimension, and thus a high resolution, can be created. As a next step, a part of the material is removed in accordance with a mask formed by the remaining parts of the lower and upper mask layers.

The method can be applied to create small structures, e.g., small trenches, and to this end, in an advantageous embodiment the step of removing a part of the lower mask layer and/or the upper mask layer in accordance with at least the second pattern comprises removing a part of the lower mask layer in accordance with the second pattern overlaid with a pattern formed by a remaining part of the upper mask layer. After removing a part of the upper mask layer in dependency on the first pattern, a part of the lower mask layer is not covered anymore by the upper mask layer. In accordance with the displaced pattern, now a part of the uncovered lower mask layer is removed effectively in accordance with a pattern formed by the second pattern overlaid with the remaining part of the upper mask layer, i.e., the remaining part of the upper mask layer after removal of a part of the upper mask layer in dependency on the first pattern. As a next step, a part of the underlying material can be removed with the resulting mask formed by the remaining parts of the lower and the upper mask layers. Due to the removal of the smaller part of the lower mask layer, small structures, such as small trenches or other openings can be created in the material.

Alternatively, or in addition thereto, it is possible with embodiments of the method to create small remaining parts, e.g., small spacings in the material, and to this end, in an advantageous embodiment the step of removing a part of the lower mask layer and/or the upper mask layer in accordance with at least the second pattern comprises removing a part of the upper mask layer in accordance with the second pattern, and removing a part of the lower mask layer in accordance with a pattern formed by the upper mask layer. Thus, following the removal of a part of the upper mask layer in dependency on the first pattern, a part of the upper mask layer is removed in dependency on the second pattern. As a result, small structures, e.g., small spacings of the upper mask layer remain, the dimension of which is determined by the original width of the pattern as determined by the mask and by the displacement of the second pattern with respect to the first pattern. Then, a part of the lower mask layer is removed in dependency on the pattern formed by the upper mask layer, followed by the removal of the underlying material. As a result, a small spacing of underlying material remains, the dimension of which is essentially determined by the displacement of the second pattern with respect to the first pattern and the original width of the pattern.

Advantageously, the removal of a part of any of the mask layers, i.e., the lower mask layer and/or the upper mask layer, is performed by selective etching of the respective layer in accordance with the respective pattern. As a result, only the respective layer, i.e., the upper mask layer or the lower mask layer is etched, and not the other one of the mask layers.

The material can comprise an organic and/or an inorganic material. For inorganic materials, such as inorganic dielectric materials, it is difficult to achieve a good selectivity towards the mask layers. To solve this problem, in an advantageous embodiment, the material comprises a layer of organic material covering a layer of inorganic material. The removal of a part of the material in accordance with a mask formed by the remaining parts of the lower and the upper mask layers comprises removing a part of the organic material in accordance with the mask formed by remaining parts of the lower and the upper mask layers, removing a part of the inorganic material in accordance with the mask formed by a remaining part of at least the organic material, and removing the remaining part of the organic material. Thus, the organic material is patterned in accordance with the steps as described above, and then a part of the inorganic material is removed using the remaining part of the organic material as a mask, and the remaining part of the organic material can be removed, after which the desired pattern in the organic material results.

In any of the embodiments described above, the method advantageously comprises the further step of removing the remaining parts of the lower and the upper mask layers. The layers can be removed by any suitable removal technique, such as wet or dry etching, chemical mechanical polishing.

BRIEF DESCRIPTION OF THE DRAWINGS

Further advantages and features of the invention will now be described with reference to the drawing, in which non-limiting embodiments of the invention are shown, in which.

DETAILED DESCRIPTION OF CERTAIN INVENTIVE EMBODIMENTS

Figure 1A:
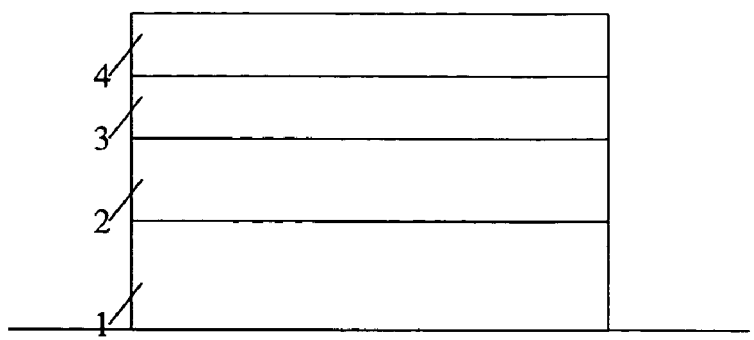
FIGS. 1A to 1D show a cross-sectional view of mask layers and layers of material in which a patterning scheme according to the invention is shown.
Figure 1B:
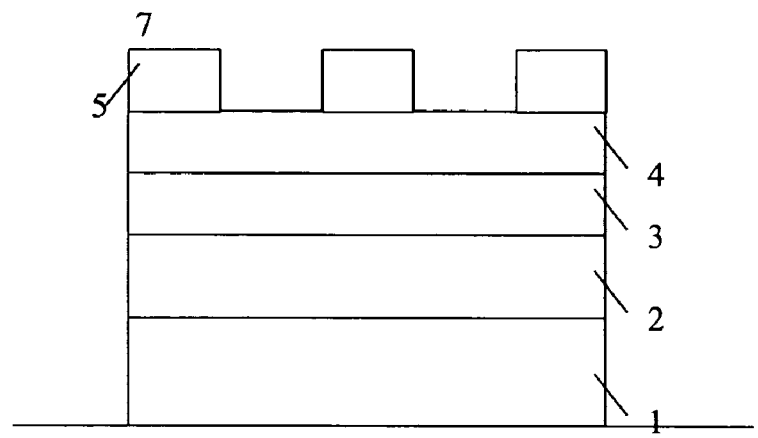

FIGS. 1A-1D show a cross-sectional view of a (part of a) semiconductor structure comprising an inorganic dielectric 1 formed upon a substrate 7. This substrate can be a conductive or semiconductive substrate such as silicon, germanium, silicon-on-insulator. It can be a non-conductive substrate such as a ceramic plate, a quartz plate, a thin film substrate. On top of the inorganic dielectric a layer of organic material 2 is provided. The layer of organic material 2 in turn is covered by a lower mask layer, indicated in the Figures as hard mask 2 (inorganic), which in turn is covered by an upper mask layer, indicated in the Figures as hard mask 1 (inorganic). The inorganic material is the layer that needs to be patterned and the other layers shown are sacrificial layers used in the process. On top of the structure, a layer of resist 5 is applied and, as shown in FIG. 1B, a pattern is transferred into the resist 5, e.g. by means of a standard lithography step.

Figure 1C:
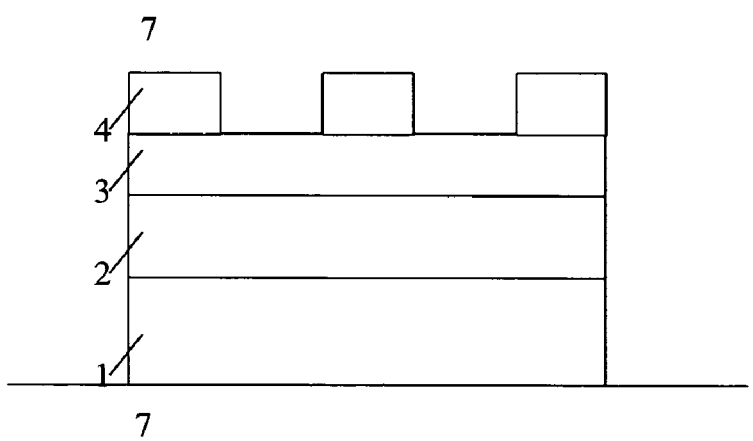
Figure 1D:
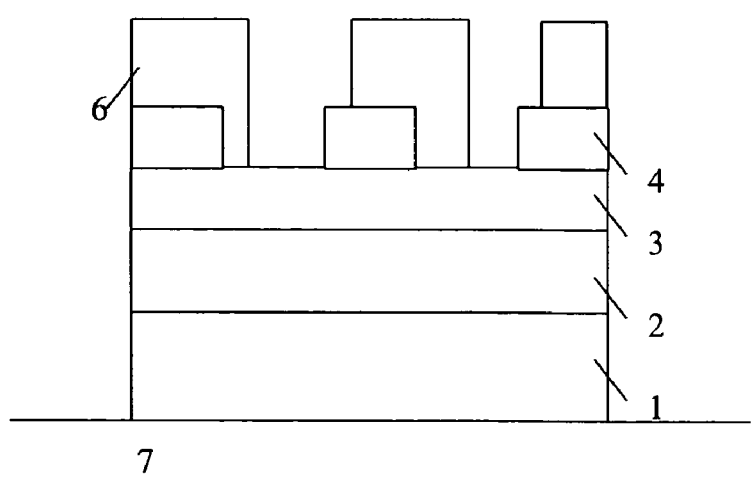

As shown in FIG. 1C, the pattern is now etched into the upper mask layer 4 by using an etch recipe that is selective towards the lower mask layer, i.e. only etches the upper mask layer 4 and does not etch the lower mask layer 3. Then, the resist 5 is stripped, the result of which is shown in FIG. 1C. Next, a new layer of resist 6 is provided on top of the structure and the pattern is again transferred into the resist 6, and the applicable portions of the resist 6 are removed in dependency on the pattern, in a way similar to the pattern as shown with reference to FIG. 1B, however the second pattern as shown with reference to FIG. 1D is displaced over a distance with respect to the earlier (i.e. the first) pattern as shown with reference to FIG. 1B. The pattern in the resist 6 in FIG. 1D creates a pattern on the upper mask layer 4, where present, and on the lower mask layer 3 at locations where the upper mask layer 4 has been removed. Subsequent to formation of the structure depicted in FIG. 1D, two different approaches can be used, one for the creation of a small trench, and the other for the creation of a small spacing. The further steps for the creation of a small trench are shown with reference to FIGS. 2A-2D, while the further steps for the creation of a small spacing are shown with reference to FIGS. 3A-3D. In both cases, the further steps comprise the removal of a part of the lower mask layer and/or the upper mask layer in accordance with at least the second pattern, and the removal of a part of the material, i.e. the organic or inorganic layer, in accordance with a mask formed by remaining parts of the lower and upper mask layers.

Figure 2A:
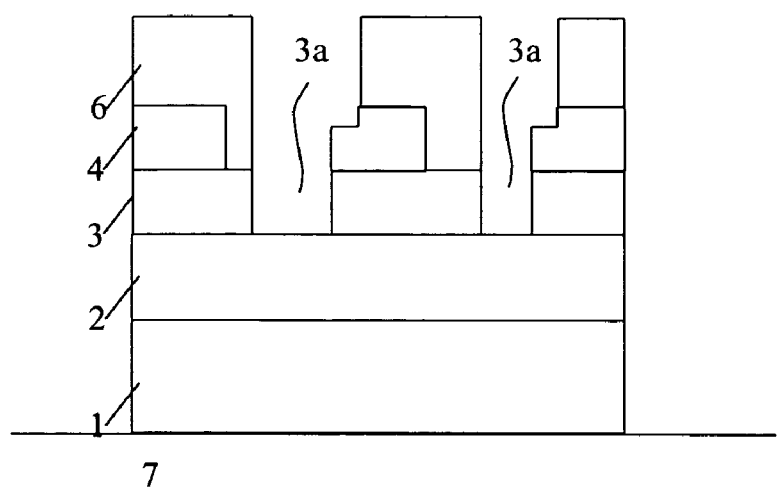
FIGS. 2A to 2D also show a cross-sectional view of mask layers and layers of material, showing steps for the creation of a small trench in succession to the steps according to FIG. 1.
Figure 2B:
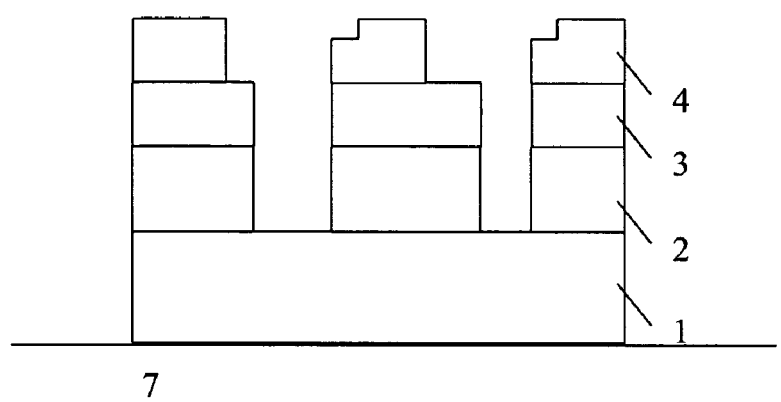
Figure 2C:
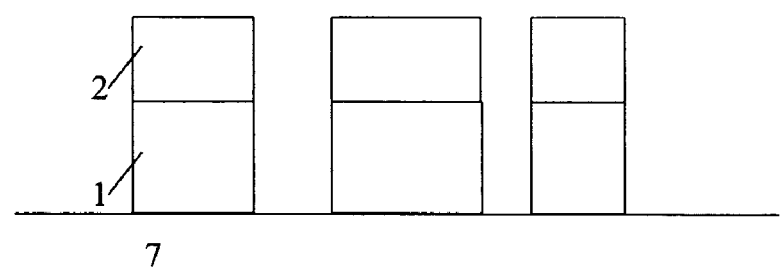
Figure 2D:
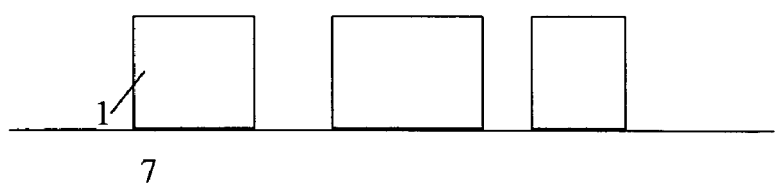

As shown in FIG. 2A, starting from the situation as shown in FIG. 1D, as a next step the part of the lower mask layer 3 is etched with an etch recipe that is selective towards the upper mask layer 4, and thus does not affect the organic material 2 or the upper mask layer 4. As a result, small trenches are created in the lower mask layer 3, the trenches being indicated by 3A. The small trenches 3A in the lower mask layer 3 have a width that consists only of the overlapping exposed parts of the first pattern and the second pattern. Thus, the dimension (in this example the width) of the trench 3A is reduced as compared to the width of the opening in the first pattern, such as e.g. in the resist 5 and the upper mask layer 4, or in the second pattern, such as e.g. in the resist 6. As a next step, as shown with reference to FIG. 2B, the organic material 2 is etched thereby also removing the resist 6. Due to the small dimensions of the trench 3A in the lower mask layer 3, the trenches in the organic material 2 will also have the same or substantially the same small dimension. Next, as shown with reference to FIG. 2C, the pattern as present in the organic material 2 is etched into the inorganic dielectric 1, and subsequently the two hard masks 3, 4 are removed. Finally, also the organic material 2 will be removed, as shown in FIG. 2D.

Figure 3A:
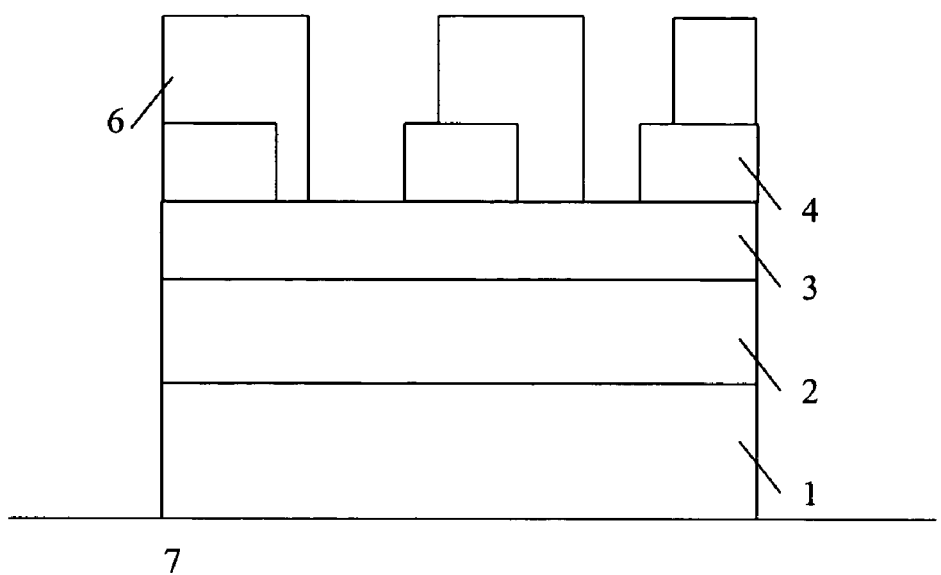
FIGS. 3A to 3F show a cross-sectional view of mask layers and material layers, showing steps leading to the creation of a small spacing in succession to the steps according to FIG. 1.
Figure 3B:
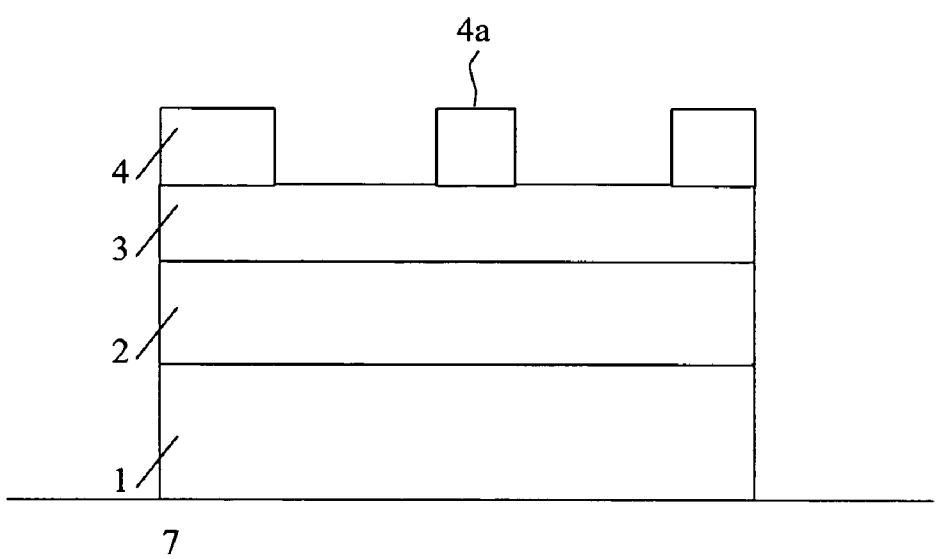
Figure 3C:
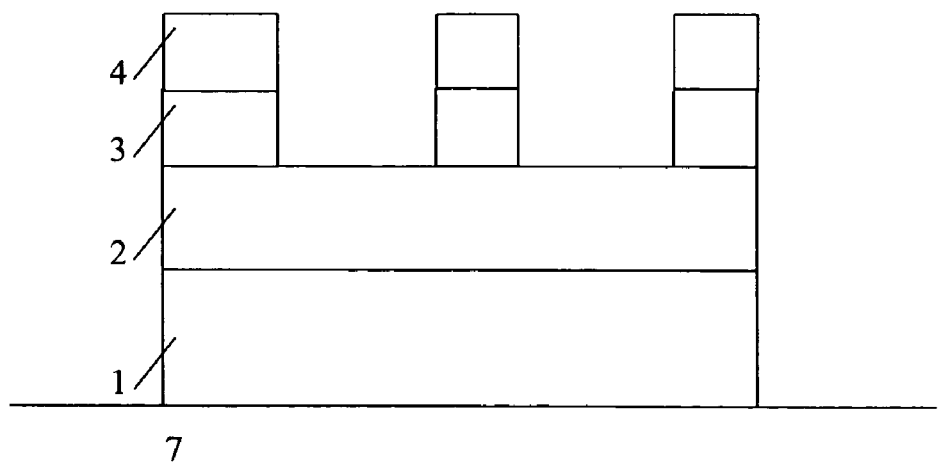
Figure 3D:
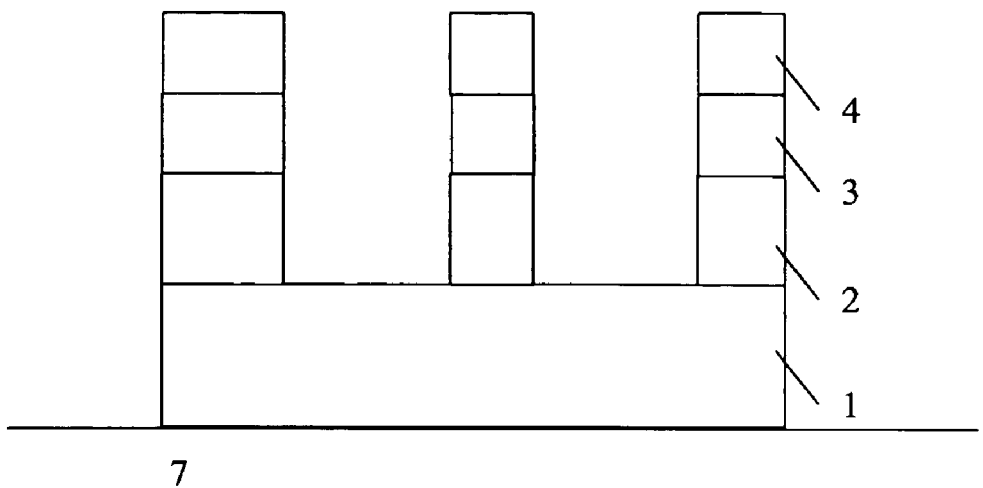
Figure 3E:
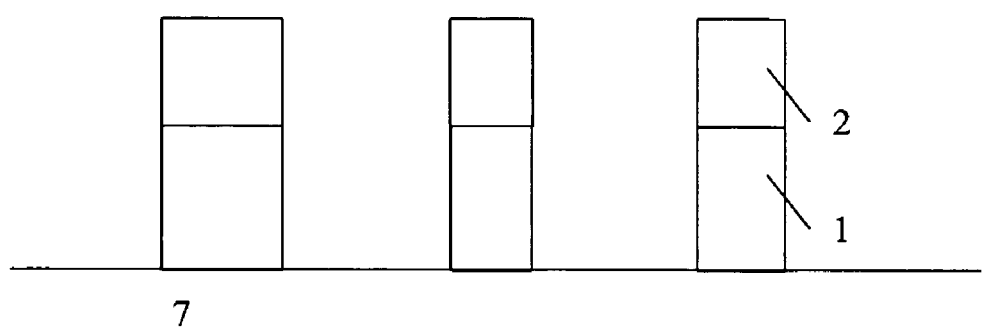
Figure 3F:
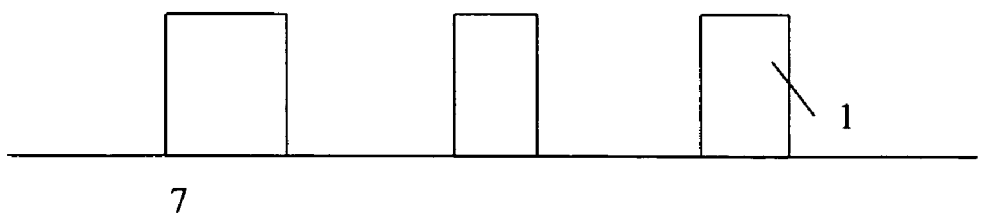

Now, starting from the situation as shown in FIG. 1D, further steps for creating a small spacing will be shown with reference to FIGS. 3A-3F. After having performed the steps as described with reference to FIGS. 1A-1D, as a next step, as shown with reference to FIG. 3A, the upper mask layer 4 is again selectively etched with the second pattern as formed in the resist 6. Then the resist 6 is removed, e.g. stripped afterwards, as shown in FIG. 3B. As a result, a spacing 4a is created, of which the dimension is smaller than the dimension obtainable with the resolution of the first pattern and the second pattern. It is remarked that the selective etching of the upper mask layer 4 is to be interpreted as an etching operation which (substantially) does not affect the lower mask layer 3, and vice versa. Next, the lower mask layer 3 is etched selectively, without affecting the upper mask layer 4, the result of which is shown in FIG. 3C. As a result, the spacing 4a now defined in the upper mask layer 4 and the lower mask layer 3 consists only of the overlapping parts of the two patterns. Thus, the dimensions of the spacing 4a are reduced as compared to the spacing of the first and second pattern. Then, the pattern in the lower mask layer 3 and/or upper mask layer 4 is used as a mask to etch the organic layer 2, the result of which is shown in FIG. 3D. Following this step, the pattern now present in the organic layer 2 is used as a mask for the inorganic layer 1 when etching the inorganic layer 1. In this etching step, also the lower mask layer 3 and upper mask layer 4 are etched, the result of which is shown in FIG. 3E. Finally, the inorganic material 2 is removed, for example stripped.

Although in FIGS. 1-3 only a one-dimensional example has been shown in which a displacement of the second pattern with regard to the first pattern is a one-dimensional displacement, it will be appreciated by the skilled person that the mask can also be displaced such that the second pattern is displaced in two dimensions in a plane of the layer of materials. Thus, structures having a small dimension can be achieved in two dimensions in the plane of the material layers with one sequence of process steps as described with reference to FIG. 1 and FIG. 2 or with reference to FIG. 1 and FIG. 3. Further, as the displacement of the second pattern with reference to the first pattern can be small, and the displacement determines the smallest dimensions that can be obtained in the layers, there is no fundamental limit to the smallest dimensions that can be obtained with the method according to the invention.

By making use of a layer of organic material 2 covering the inorganic material 1 to be patterned, the problem that it is difficult to have a good selectivity towards the (inorganic) hard masks, i.e. the upper mask layer 4 and lower mask layer 3, is solved. Such selectivity is difficult to achieve with only an inorganic dielectric material. By using the layer of organic material 2, it is possible to first etch the organic material to the small dimension making use of the method according to the invention and then use the organic material 2 as a mask for etching the inorganic material 1.

The creation of a pattern with smaller dimensions in a resist in general requires a sufficiently thin resist layer to avoid problems caused by collapse of the remaining resist material. As a general rule known in the art, the thickness of the resist is not allowed to be more than three times a critical, i.e. minimum, dimension of a structure to be created. By making use of the layer of organic material covering the inorganic material and creating the desired pattern (i.e. the pattern resulting from the first pattern in combination with the second pattern) in the organic material, a better mechanical stability can be achieved as an organic material can be selected having good mechanical stability properties.

Thus, by creating a second pattern which is identical to the first pattern but displaced over a distance with respect to the first pattern, removing a part of the mask layers in accordance with at least the second pattern and removing a part of the material in accordance with a mask formed by remaining parts of the lower and upper mask layers, structures can be created with smaller dimensions than the resolution of the pattern itself, i.e. the resolution determined e.g. by an imaging system for applying the pattern on the layers. Hence, with less advanced steppers and resist systems, structures having a smaller dimension such as smaller transistor gates can be created.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. A method of manufacturing a semiconductor device wherein a pattern is created in a material, the method comprising:

covering the material with a lower mask layer;

covering the lower mask layer with an upper mask layer;

creating a first pattern on the upper mask layer via a lithographic mask;

removing a part of the upper mask layer in dependency on the first pattern;

creating, via the lithographic mask, a second pattern on the upper mask layer or on the lower mask layer at locations where the upper mask layer has been removed, the lithographic mask being displaced over a distance such that the second pattern is displaced with respect to the first pattern;

removing a part of at least the lower mask layer in accordance with at least the second pattern; and removing a part of the material in accordance with remaining parts of the lower and the upper mask layers.

2. The method according to claim 1, wherein removing a part of at least the lower mask layer in accordance with at least the second pattern comprises:

removing a part of the lower mask layer in accordance with the second pattern overlaid with a pattern formed by a remaining part of the upper mask layer.

3. The method according to claim 1, wherein removing a part of at least the lower mask layer in accordance with at least the second pattern comprises:

removing a part of the upper mask layer in accordance with the second pattern; and removing a part of the lower mask layer in accordance with a pattern formed by the upper mask layer.

4. The method according to claim 1, wherein the removal of a part of the lower mask layer or the upper mask layer in accordance with the first or the second pattern comprises selectively etching the respective layer in accordance with the pattern.

5. The method according to claim 1, wherein the material comprises at least one of an organic and an inorganic material.

6. The method according to claim 5, wherein the material comprises a layer of organic material covering a layer of inorganic material.

7. The method according to claim 6, wherein the removal of a part of the material in accordance with the remaining parts of the lower and the upper mask layers comprises:

removing a part of the organic material in accordance with the mask formed by remaining parts of the lower and the upper mask layers;

removing a part of the inorganic material in accordance with the mask formed by a remaining part of at least the organic material; and removing the remaining part of the organic material.

8. The method according to claim 1, further comprising removing the remaining parts of the lower and upper mask layers.

* * * * *